United States Patent
Bhullar (10) Patent No.: US 11,271,366 B2
(45) Date of Patent: Mar. 8, 2022

(54) NON-LINEAR FILTER FOR DML

(71) Applicant: SEMTECH CANADA CORPORATION, Burlington (CA)

(72) Inventor: Gurpreet S. Bhullar, Ottawa (CA)

(73) Assignee: SEMTECH CANADA CORPORATION, Burlington (CA)

(*) Notice: Subject to any disclaimer, the term of this patent is extended or adjusted under 35 U.S.C. 154(b) by 0 days.

(21) Appl. No.: 17/080,692

(22) Filed: Oct. 26, 2020

(65) Prior Publication Data

US 2021/0044086 A1 Feb. 11, 2021

Related U.S. Application Data

(63) Continuation of application No. 14/695,890, filed on Apr. 24, 2015, now abandoned.

(60) Provisional application No. 61/984,621, filed on Apr. 25, 2014.

(51) Int. Cl.
| | | |
|---|---|---|
| H04B 10/50 | (2013.01) | |
| H04B 10/58 | (2013.01) | |
| H01S 5/042 | (2006.01) | |
| H01S 5/183 | (2006.01) | |

(52) U.S. Cl.
CPC ......... *H01S 5/0427* (2013.01); *H04B 10/504* (2013.01); *H04B 10/58* (2013.01); *H01S 5/183* (2013.01)

(58) Field of Classification Search
CPC ....... H01S 5/0427; H01S 5/183; H04B 10/58; H04B 10/504
See application file for complete search history.

(56) References Cited

U.S. PATENT DOCUMENTS

| | | |
|---|---|---|
| 5,424,680 A | 6/1995 | Nazarathy |
| 6,973,138 B1 | 12/2005 | Wright |
| 7,826,752 B1 | 11/2010 | Zanoni et al. |
| 8,083,417 B2 | 12/2011 | Aronson et al. |
| 2011/0069749 A1 | 3/2011 | Forrester |
| 2013/0082773 A1 | 4/2013 | Yu |
| 2015/0063828 A1 | 3/2015 | Bliss |
| 2015/0086216 A1 | 3/2015 | Xie |

FOREIGN PATENT DOCUMENTS

EP 2634934 4/2013

OTHER PUBLICATIONS

Kumar et al., "Impact of Nonlinearities of Fiber Optic Communications," Optical and Fiber Communications Reports, 2011, p. 186.
Warm, Electronic Predistortion Strategies for Directly Modulated Laser System, 15 pages, Berlin 2009.

(Continued)

*Primary Examiner* — Leslie C Pascal
(74) *Attorney, Agent, or Firm* — Morgan, Lewis & Bockius LLP (57) ABSTRACT

A circuit is disclosed having a component having repeatable distortion characteristics; and a drive circuit for providing a drive signal and comprising a non-linear filter for pre-compensating for distortion introduced by the component having repeatable distortion characteristics in response to the drive signal, the distortion having a non-linear response to the drive signal.

16 Claims, 8 Drawing Sheets

(56) References Cited

OTHER PUBLICATIONS

Winzer et al., "Spectrally Efficient Long-Haul Optical Networking Using 112-Gb/s Polarization-Multiplexed 16-QAM," Journal of Lightwave Technology, vol. 28, No. 4, 2010. pp. 547-556.
Berndt, "Blind Adaptation of a Decision Feedback Equalizer for use in a 10Gbps Serial Link," Carleton University Thesis, Jan. 2007, 96 pages.
Chandramouli, "A Novel Analog Decision-Feedback Equalizer in CMOS for Serial 10-GB/sec Data Transmission Systems," Georgia Institute of Technology Thesis, Dec. 2007, 130 pages.
Hekkala, "Compensation of transmitter nonlinearities using predistortion techniques." University of Oulu Thesis, 2014, 102 pages.
Sewter et al., "A 3-Tap FIR Filter With Cascaded Distributed Tap Amplifier for Equalization Up to 40 Gb/s in 0.18 m CMOS," IEEE Journal of Solid State Circuits, vol. 41, No. 8, Aug. 2006, pp. 1919-1929.
Thakkar, "Design of Multi-Gb/s Multi-Coefficient Mixed-Signal Equalizers," University of California Berkeley, Thesis, 2012, 127 pages.

FIG. 1

FIG. 2
LINEAR FIR BLOCK DIAGRAM

FIG. 3
NON-LINEAR FIR BLOCK DIAGRAM

FIG. 4
SIMPLIFIED NON-LINEAR FIR FOR NRZ SIGNALLING

FIG. 5
OPTIMIZED IMPLEMENTATION FOR NRZ SIGNALLING

NON-LINEAR FILTER FOR DML

This application is a continuation of application Ser. No. 14/695,890, filed on Apr. 24, 2015, now abandoned, which claims the benefit of U.S. Provisional Patent Application No. 61/984,621, filed on Apr. 25, 2014, the contents of each of which are incorporated herein by reference.

FIELD OF THE INVENTION

The invention relates generally to communication and more particularly to optical communication.

BACKGROUND

Optical transmitters employing Directly Modulated Lasers (DML) such as Vertical Cavity Surface Emitting Lasers (VCSELs) are rated to operate up to a predetermined data rate. Problematically, when operating at higher data rates, distortion from the DML itself limits performance of the device and thus the data link. The DML transmits an optical signal that differs from the drive signal provided thereto such that signal reception is substantially affected beyond short transmission distances. Added jitter and vertical eye closure from distortion introduced by VCSEL can cause significant reduction in signal-to-noise ratio (SNR). These limitations on performance place a limit on the transmission distances for higher data rates.

Linear filters are used conventionally to partially compensate for the distortion due to the DML itself. However, linear filters fail to achieve optimal compensation for the distortion. It would be advantageous to overcome some of the shortcomings of the prior art.

SUMMARY OF EMBODIMENTS OF THE INVENTION

In accordance with an aspect of at least one embodiment there is provided a component having repeatable distortion characteristics; and a drive circuit for providing a drive signal and comprising a non-linear filter for pre-compensating for distortion introduced by the component having repeatable distortion characteristics in response to the drive signal, the error having a non-linear response to the drive signal.

In accordance with an aspect of at least one embodiment there is provided a method comprising: providing a drive current for driving a Directly Modulated Laser (DML); filtering the drive current with a non-linear filter to provide pre-compensated drive current pre-compensated for errors in a signal resulting from driving the DML with the drive current, wherein an output signal from the DML in response to the pre-compensated drive current better approximates the drive current to incur reduced errors.

In accordance with an aspect of at least one embodiment of the invention there is provided a circuit comprising: an input port for receiving a first signal; a plurality of taps, each tap comprising an input port for receiving a tap input signal, a first input port for receiving a first weight, a second input port for receiving a second other weight, and a biasing circuit for biasing an applied weighting between the first weight and the second weight to bias the tap signal, the biased tap signal for modifying the first signal.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

Figure 1:
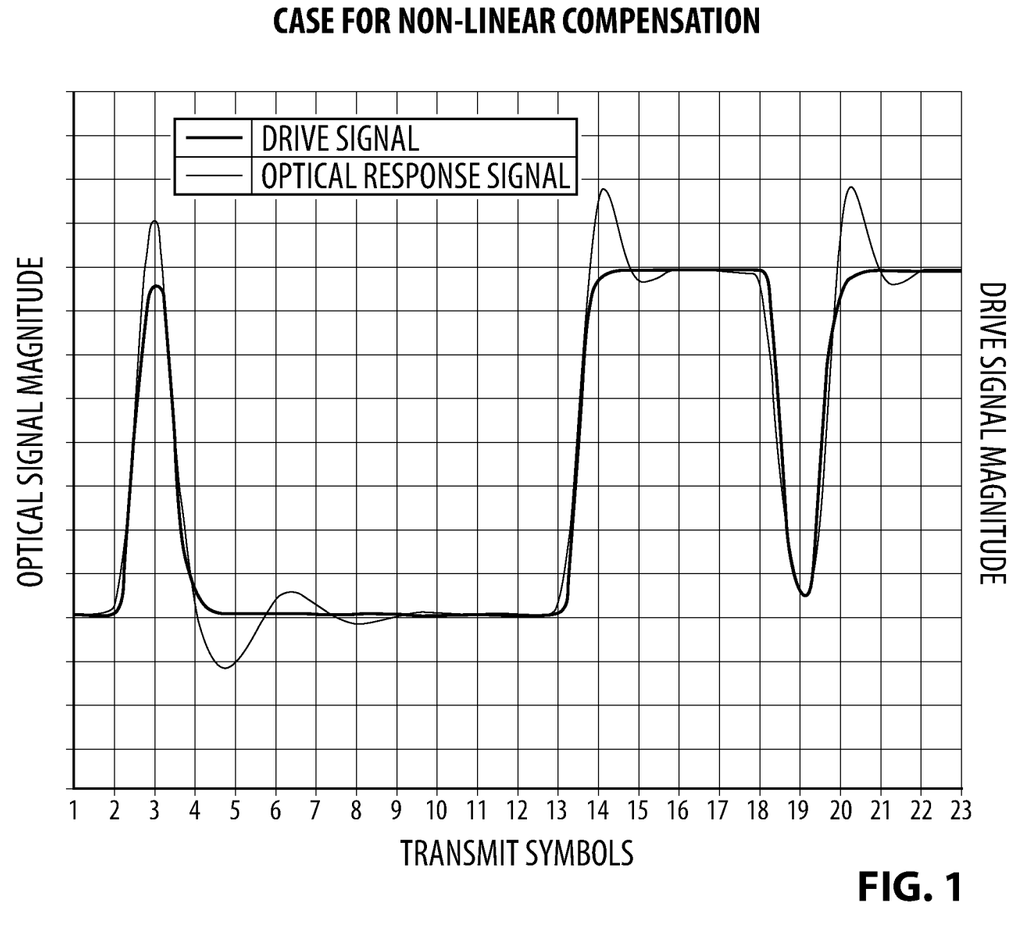
FIG. 1 illustrates a typical optical output signal amplitude of a DML (VCSEL) in response to a direct driving input signal.

Referring to FIG. 1, shown is a typical optical output signal amplitude of a Directly Modulated Laser (DML) in the form of a Vertical Cavity Surface Emitting Laser (VCSEL) in response to a direct driving input signal. As is evident, the optical signal generated (thin line) fails to follow accurately the signal provided (thick line). The resulting overshoots and undershoots add distortion to the signal. The distortion appears as both jitter affecting the width of the eye and amplitude variations affecting the opening of the eye.

Figure 6:
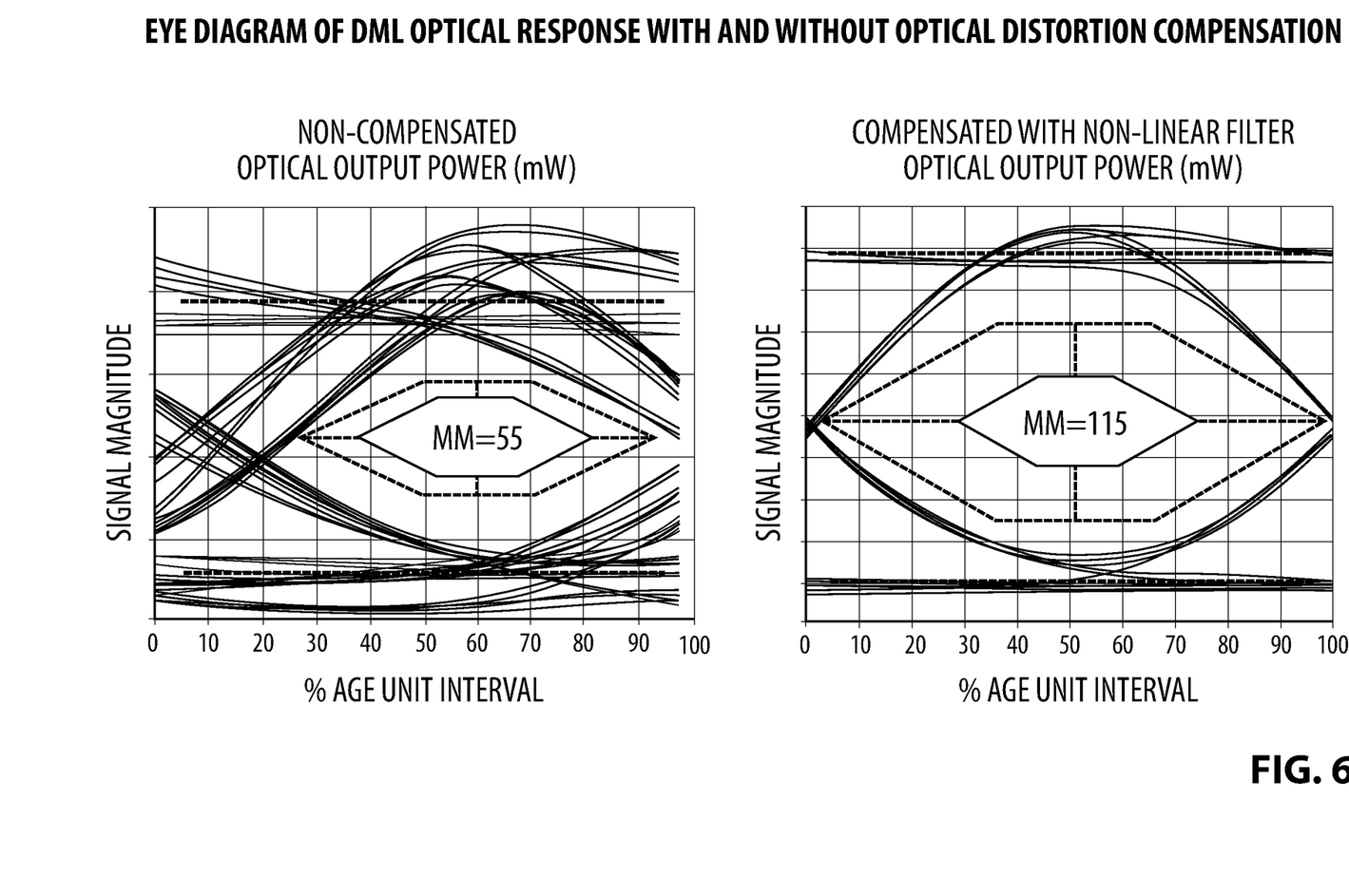
FIG. 6 is an eye diagram of an unfiltered drive signal alongside an eye diagram of an output signal corrected with a non-linear FIR filter such as that of FIG. 4 or FIG. 5.

Referring now to the eye diagram that is shown on the left-hand side of FIG. 6, the signals are distorted horizontally—i.e., increased jitter—and vertically—i.e., degraded SNR. As is evident, the inner eye opening is significantly smaller than it would be if the signal was undistorted. Correction of these distortion artifacts within the transmit signal are important to enable transmission of higher data rates over longer distances.

The distortion artifacts resulting from DML optical response are amplitude dependent and thus non-linear in nature. The rising edge and falling edge responses are different and they each need to be compensated differently. Further, compensating one edge response may adversely affect the other edge or may fail to achieve significant improvement without compensating for the other edge as well. Thus, conventional approaches using linear filters for compensating for the distortion from the DML response are not optimal.

A second problem is implementation efficiency. If the distortion is repeatable and calculable, it may be possible using a DSP to reduce the nonlinear distortion within the DML signal; that said, such an implementation would be costly and would not lend itself to inexpensive, low power and compact implementation. A more simple non-linear distortion reduction method would be preferred.

Figure 2:
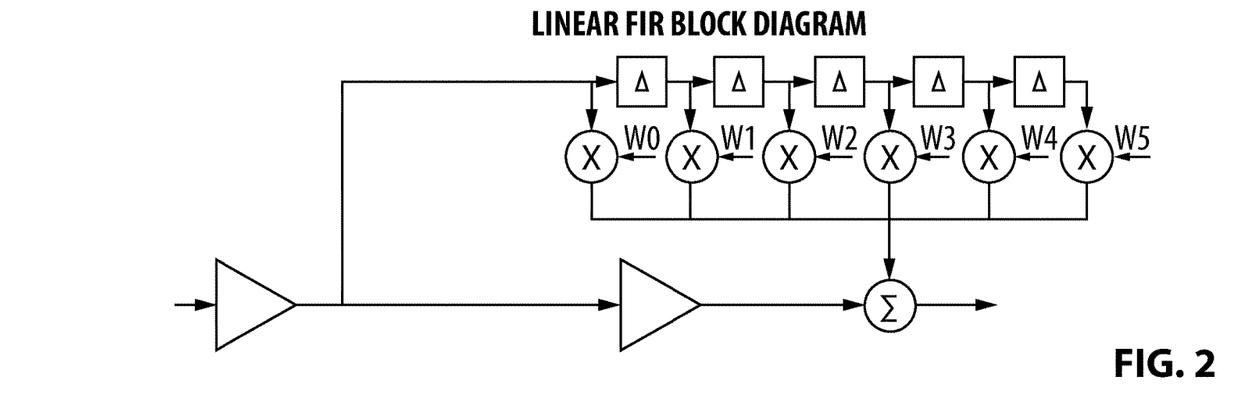
FIG. 2 is a simplified block diagram of a linear finite impulse response (FIR) filter.

Referring now to FIG. 2, shown is a simplified block diagram of a typical linear finite impulse response (FIR) filter. A signal is provided to the filter and is then summed with a weighted delayed version of the signal, termed as a delayed tap, or a plurality of weighted sequentially delayed versions of the signal or delayed taps. Linear FIR filters are well known and well studied.

Because the distortion is non-linear in nature, a linear filter is not suitable to addressing the distortion concerns completely. In fact, such a linear filter, will fail to substantially correct the problems disclosed above, reducing distortion in one of the rising or falling edge response while compounding the distortion in the other.

Figure 3:
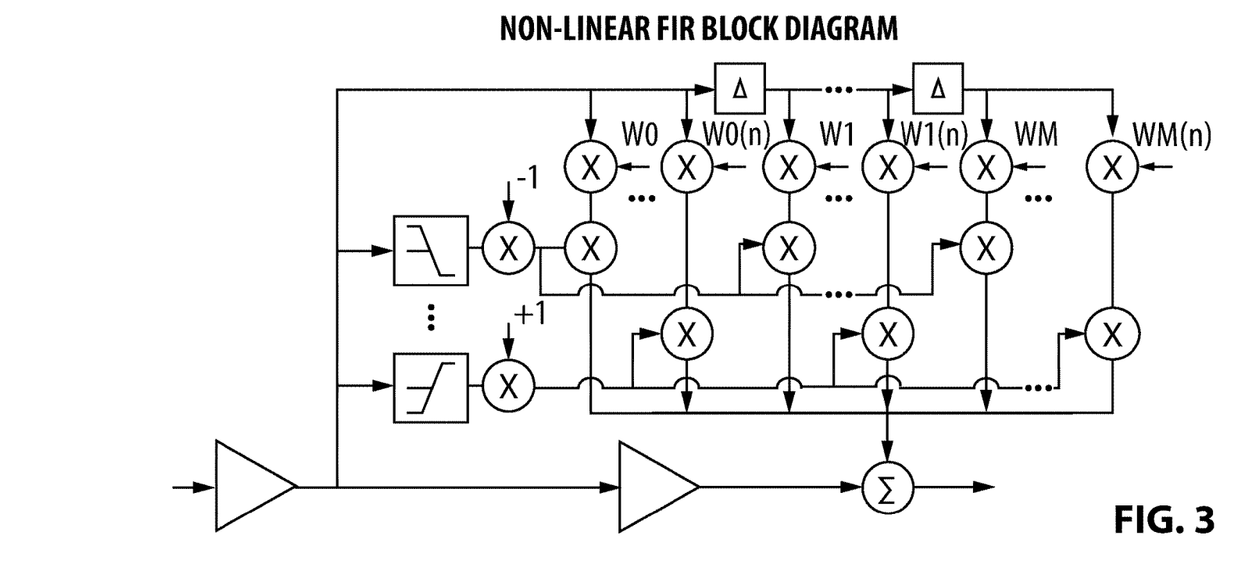
FIG. 3 is a logic diagram of non-linear FIR filter.

Referring now to FIG. 3, shown is a non-linear FIR filter design for providing pre-compensation for some of the non-linearities shown in FIG. 1. Here, a signal is provided to the filter consisting of multiple delayed taps and each tap's contribution is weighted by two different factors dependent on input signal's instantaneous amplitude, resulting in an amplitude-dependent, non-linear filter response. The filter generates a different response to each of the rising and falling edges and approximately compensates for the non-linear response of the DML in response to a driver signal. The use of two weights per tap, combined with scaling the tap contributions with instantaneous input signal amplitude, allows for non-linear filter response. While the use of the FIR architecture supports compact and efficient implementation. For example, the non-linear FIR filter shown is implementable as an analogue circuit within a semiconductor, for example, without relying on complex processing circuitry such as a DSP.

Figure 4:
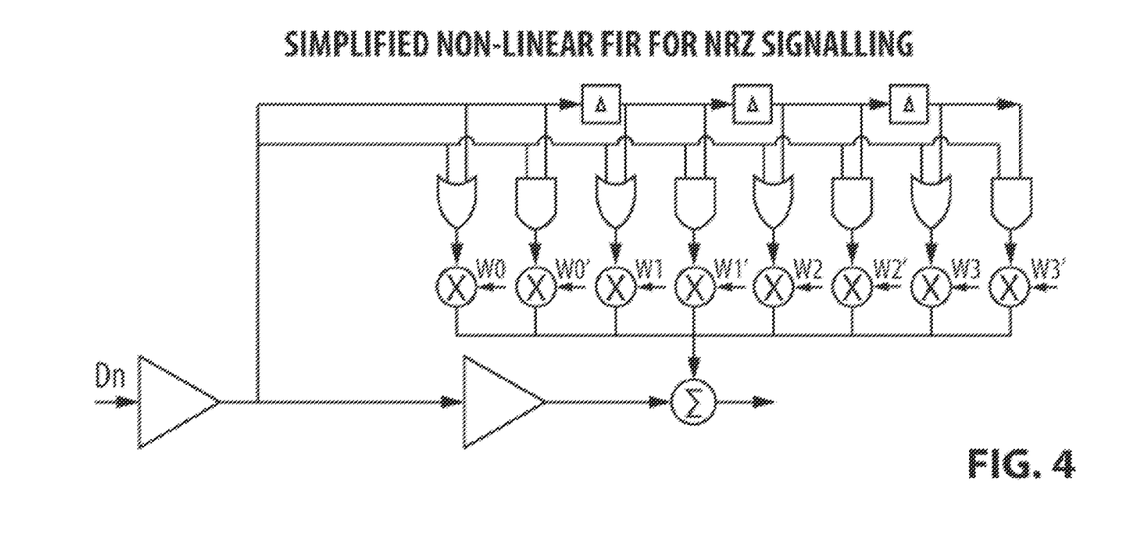
FIG. 4 is a diagram of a non-linear FIR filter implementation.

Referring now to FIG. 4, shown is a simplified diagram of a practical implementation of non-linear FIR filter for Non-Return to Zero (NRZ) signaling. Again, a signal provided is delayed and tapped, and each tap contribution is weighted differently, depending on input signal level of one or zero, to provide level dependent non-linear operation. The tap contributions are added back into the signal to provide filtering thereof. Signal scalars are reduced to gates in the filter shown, as suits an integrated hardware implementation.

Figure 5:
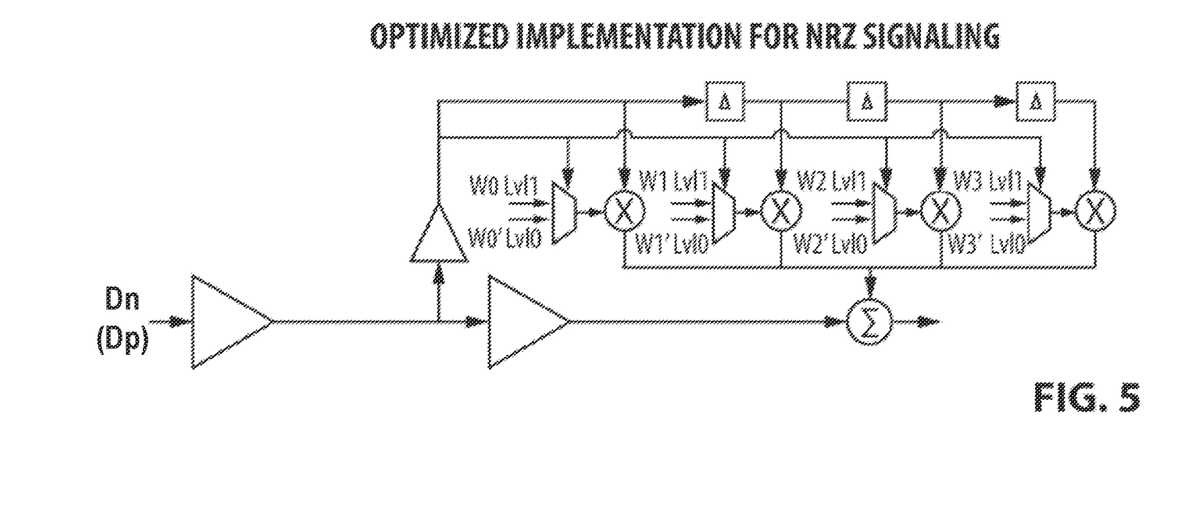
FIG. 5 is a diagram of another non-linear FIR filter implementation optimized for performance.

Referring now to FIG. 5, shown is a diagram of another non-linear FIR filter implementation optimized for performance in the present embodiment. Here again, each tap signal is acted on by two different weights. A multiplexer is used to select the weighting for multiplication. The input signal level is used to select one of the multiplexer's input weights, and the multiplier scales the tap signal as per selected weight for each stage. Since the weights for each tap switch as per the input signal's level, the filter output need not follow a linear contour. The resulting non-linear filtering pre-compensates for distortion in the DML.

Referring again to FIG. 6, shown is an eye diagram of an uncorrected output signal (left-hand side) alongside an eye diagram of an output signal corrected with a non-linear FIR filter such as that of FIG. 4 or FIG. 5 (right-hand side), sand according to the present embodiment. As is shown, the eye has opened up considerably with reduced jitter and improved SNR. An improved eye diagram is typically reflective of improved ability to transmit over greater distances and reduced error in signal reception.

Figure 7:
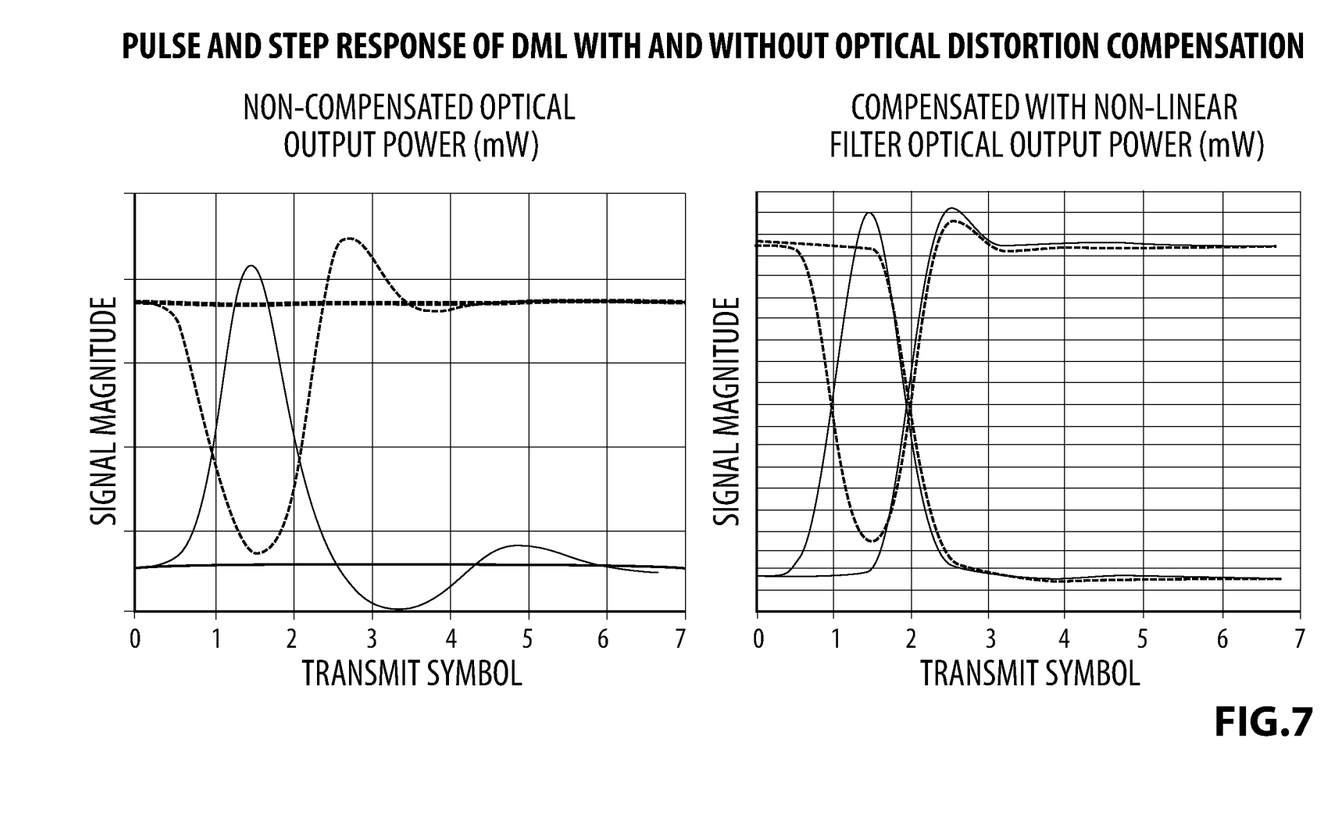
FIG. 7 is a graphical representation of the transmit signal before and after filtering with a 4 tap non-linear FIR filter.

FIG. 7 shows a graphical representation of the transmit signal before (left-hand side) and after filtering with a 4 tap non-linear FIR filter (right-hand side). Most noteworthy, signal distortion is greatly reduced after a short time reducing distortion central to the eye. At the rising edge and falling edge, distortion remains, but it is significantly reduced. Thus, the eye opening in an eye diagram is improved. Further, other frequency components resulting from the distortion are reduced with reduced distortion.

Just looking to the falling edge, it is seen that whereas without filtering, the signal bounces at the bottom down and up, with filtering the signal remains substantially in alignment with the desired signal contour. On the rising edge, two notable bounces are reduced to one smaller bounce, thereby limiting the effect of the bounce on the top of the eye.

Figure 8A:
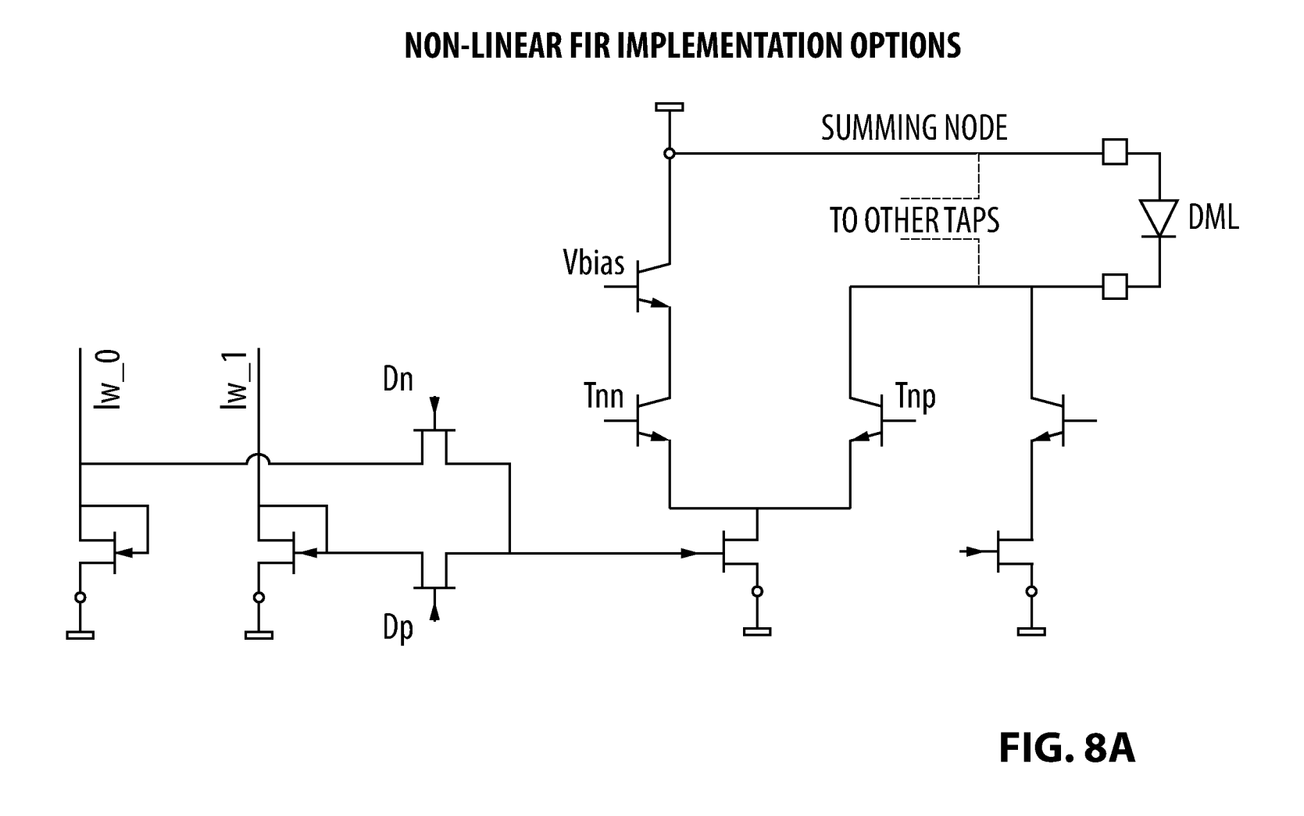
FIG. 8A shows a sample circuit for implementing a non-linear filter for pre-compensating a drive signal for driving a directly modulated laser (DML).
Figure 8B:
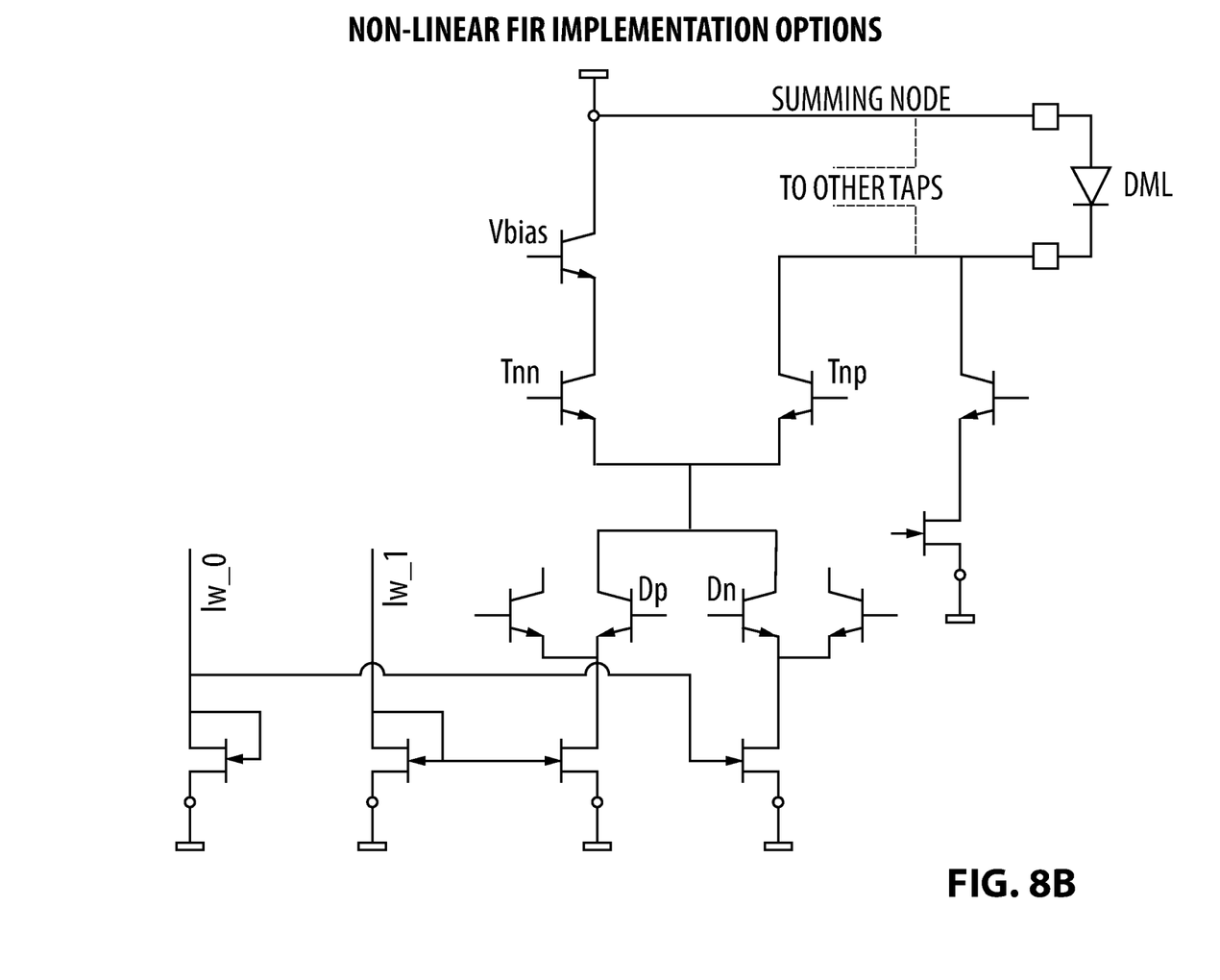
FIG. 8B shows another sample circuit for implementing a non-linear filter for pre-compensating a drive signal for driving a directly modulated laser (DML).
Figure 8C:
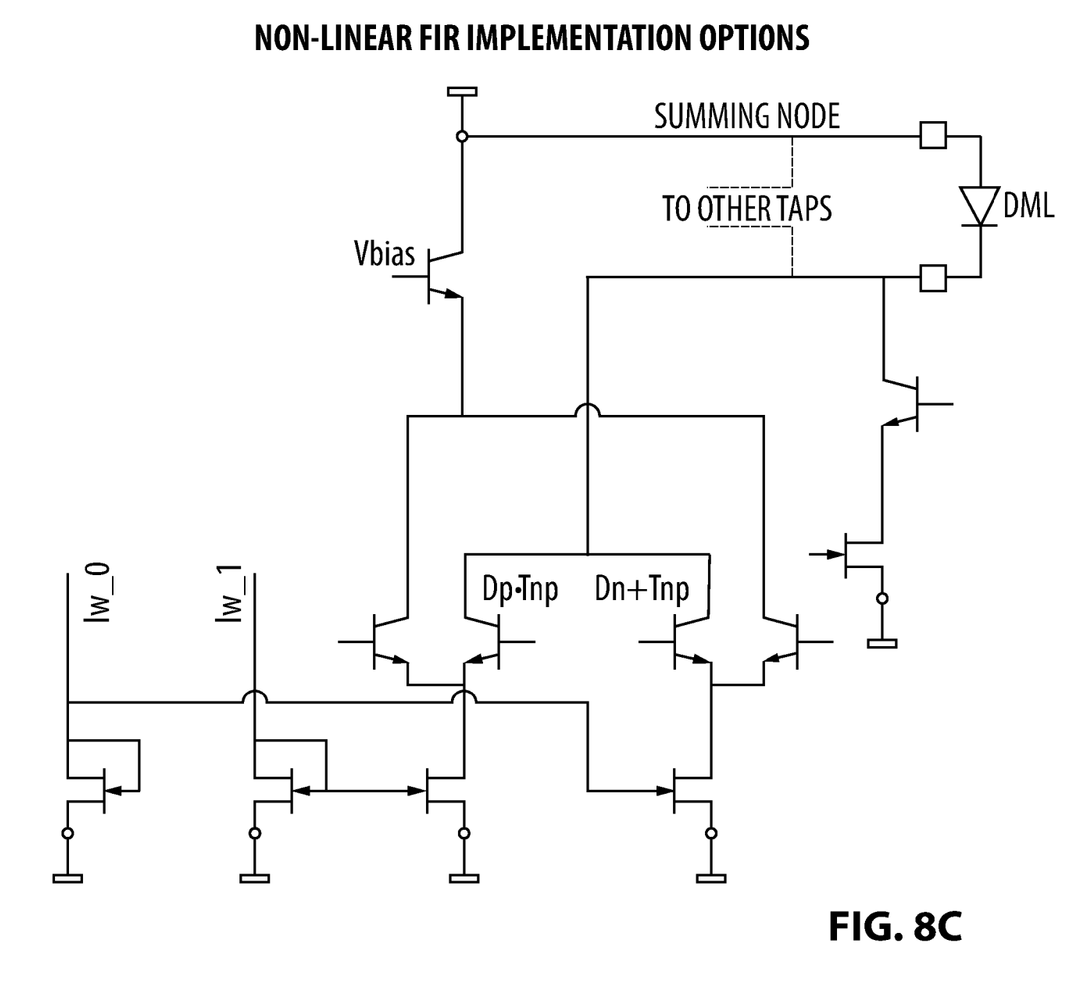
FIG. 8C shows another sample circuit for implementing a non-linear filter for pre-compensating a drive signal for driving a directly modulated laser (DML).

FIGS. 8A-C shows three sample circuits for implementing a non-linear filter according to the embodiment. Each circuit has different drawbacks and advantages, but effectively, the filter design allows not only for analogue hardware implementation, but for varied implementation to take advantage of different power sources, power levels, and other design criteria. Architectures supporting implementation flexibility are typically desirable as they are useful in many different applications and well suited to implementation in many different devices.

As is seen in each of the circuit diagrams, two currents proportional to weights are shown designated with "w" (w_0 and w_1) being multiplexed into the scaling circuit for each tap determined by level of the input signal (Dp, Dn). Alternatively, the currents proportional to weights are applied to a scaling circuit such that they are first scaled by the input signal (Dp, Dn) followed by the tap signal (Tnp, Tnn). Further alternatively, currents proportional to the weights are applied to a scaling circuit where the signals being scaled are a logical combination of input signal (Dp, Dn) and the tap signal (Tnp, Tnn). The logical combinations include input signal (Dp, Dn) logically OR'd with tap signal (Tnp, Tnn) designated as "Dp+Tnp"; and input signal (Dp, Dn) logically AND'd with tap signal (Tnp, Tnn) designated as "Dp.Tnp". The scaled version of these logically combined signals in current form is then summed through a wire OR to produce a single tap contribution that is dependent on the weights and the input signal amplitude. Multiple tap contributions are summed to generate a resulting signal that has an amplitude dependent non-linear characteristic.

Though FIGS. 8A-C show one tap for each architecture, it is understood by those of skill in the art that any number of taps is supported and selection of a number of taps is dependent upon the circuit design requirements. Further, though two weights are shown, the filter architecture described above may be implemented with additional weights to correct for more complex amplitude dependent non-linear effects requiring higher granularity or resolution in amplitude levels.

Though the above embodiments are directed to pre-compensating the drive current, filtering of received signals to improve data detection is also supported. The general architecture for non-linear filter as shown in FIG. 3 can be used for a received signal. In end-to-end fibre optic communications such as fibre optic cables for communicating, the transmitter and receiver pairing is known and the weights within the receiver are tuned for use with a specific receiver or are adjusted based on a transmitter from which a signal is received.

In use, a circuit is designed and manufactured. Once manufactured, the circuit is tested with a representative DML component and based on the combined circuit and DML transmit signal characteristics, the non-linear FIR filter weights are adjusted to pre-compensate the drive current for the DML. Thus, each product is compensated individually, accounting for known DML response issues as well as circuit specific response issues for a given DML. Once compensated, the circuit operates in compensated mode. Optionally, the circuit's operating parameters are readjusted to re-compute the weights for the non-linear FIR filter at intervals.

In another embodiment, the optical output signal is tapped and provided as feedback to the transmit circuit where the non-linear FIR filter is adjusted in response to changes in performance of the DML output signal. Further optionally, the circuit is designed and manufactured with fixed weighting for the non-linear FIR filter.

In another embodiment, the manufactured devices are tested, the non-linear FIR filter is tuned—weights are set—and the circuit is tested again. Based on its performance, the circuit is assigned a quality level. Thus, some manufactured drive circuits support 25 GHz while others support only 15 GHz—determined after tuning in the manufacturing stage. This allows for a more coarse tuning process with the performance assignment then dividing between circuits with best tuning and those with less effective tuning results.

Numerous other embodiments may be envisioned without departing from the scope of the invention.

What is claimed is:

1. A semiconductor analogue circuit for pre-compensating a distortion being introduced by a directly modulated laser (DML), wherein the distortion reduces a signal-to-noise ratio (SNR) and degrades performance of the DML and a data link, wherein the distortion is amplitude dependent and time dependent, wherein the amplitude dependent distortion produces non-linearity, wherein the distortion has different distortion characteristics for a transition to a ones level and to zeros level, wherein the transition is the transition of the DML's response signal, wherein the semiconductor analogue circuit is configured to provide a pre-compensated drive signal to the DML to pre-compensate the distortion being introduced by the DML, wherein the semiconductor analogue circuit comprises:
an input circuit;
a non-linear filter coupled to the input circuit; and
a summer coupled to the input circuit and the non-linear filter,
wherein the input circuit comprises a drive input node and a drive output node,
wherein the input circuit is configured to receive a drive input signal at the drive input node and configured to provide a drive signal at the drive output node,
wherein the non-linear filter comprises a plurality of taps arranged in parallel,
wherein each tap of the plurality of taps comprises a tap output node,
wherein each tap of the plurality of taps comprises a multiplexer and a multiplier,
wherein the multiplexer together with the multiplier are configured to generate a non-linear tap output signal that is both dependent on the drive signal's instantaneous amplitude and dependent on time, the non-linear tap output signal being produced at the tap output node,
wherein the multiplexer is coupled to the drive output node,
wherein the multiplexer comprises a first multiplexer input node, a second multiplexer input node, a selector node, and a multiplexer output node,
wherein the multiplexer is configured to receive a first weight signal at the first multiplexer input node, configured to receive a second weight signal at the second multiplexer input node, and configured to receive the drive signal at the selector node,
wherein the multiplexer is configured to select the first weight signal or the second weight signal based on the drive signal's instantaneous amplitude, and configured to produce, at the multiplexer output node, the selected one of the first weight signal or the second weight signal, wherein:
the instantaneous amplitude of the drive signal itself is used during an operation of the multiplexer to select the first weight signal or the second weight signal for the multiplexer;
when the drive signal's instantaneous amplitude is level one, the multiplexer is configured to select the first weight signal, and the first weight signal shapes the non-linear tap output signal at the tap output node;
when the drive signal's instantaneous amplitude is level zero, the multiplexer is configured to select the second weight signal, and the second weight signal shapes the non-linear tap output signal at the tap output node;
the level one is different from the level zero; and
the first weight signal is different from the second weight signal, such that the non-linear tap output signal at the tap output node has a first characteristic for the level one instantaneous amplitude of the drive signal, which is different from a second characteristic for the level zero instantaneous amplitude of the drive signal,
wherein the multiplier is coupled to the drive output node and the multiplexer output node,
wherein the multiplier comprises a first multiplier node coupled to the drive output node, a second multiplier node coupled to the multiplexer output node, and a multiplier output node,
wherein the multiplier is configured to receive a tap signal at the first multiplier node, configured to receive the selected one of the first weight signal or the second weight signal at the second multiplier node, configured to scale the tap signal based on the selected one of the first weight signal or the second weight signal, and configured to produce the scaled tap signal at the multiplier output node,
wherein the tap signal is scaled differently depending on the instantaneous amplitude of the drive signal, generating a non-linear drive signal contribution at the multiplier output node,
wherein the non-linear tap output signal is the scaled tap signal,
wherein the tap output node is the multiplier output node,
wherein the tap signal for a first tap of the plurality of taps comprises the drive signal,
wherein each of the tap signals for other taps of the plurality of taps comprises a respective delayed version of the drive signal such that the non-linear tap output signal depends on a previous state of the drive signal, and the non-linear tap output signal's non-linear characteristics are time dependent,
wherein the summer is coupled to the drive output node and the tap output nodes of the plurality of taps, and
wherein the summer is configured to sum the drive signal from the drive output node and the non-linear tap output signals from the tap output nodes of the plurality of taps, configured to produce the pre-compensated drive signal which is dependent on the instantaneous amplitude of the drive signal and dependent on the previous state of the drive signal, and configured to drive the DML using the pre-compensated drive signal.

2. The semiconductor analogue circuit of claim 1, wherein:
the first weight signal comprises a first current signal;
the second weight signal comprises a second current signal different from the first current signal;
the drive signal comprises a differential drive signal;
the selector node comprises: a first differential selector node configured to receive a first leg of the differential drive signal; and a second differential selector node configured to receive a second leg of the differential drive signal;
the tap signal comprises a first differential tap signal and a second differential tap signal;
the first multiplier node comprises: a first differential multiplier node configured to receive the first differential tap signal; and a second differential multiplier node configured to receive the second differential tap signal; and
the summer comprises a first differential summer node and a second differential summer node.

3. The semiconductor analogue circuit of claim 1,
wherein the drive signal comprises a differential drive signal;
wherein the multiplexer comprises:
a first field effect transistor comprising a first gate coupled to a first drain, wherein the first drain of the first field effect transistor is configured to receive the first weight signal;
a second field effect transistor comprising a second gate coupled to a second drain, wherein the second drain of the second field effect transistor is configured to receive the second weight signal;
a pair of differential field effect transistors comprising a first differential field effect transistor and a second differential field effect transistor, wherein
a gate of the first differential field effect transistor is configured to receive a first leg of the differential drive signal, and a drain of the first differential field effect transistor is coupled to the first drain of the first field effect transistor; and
a gate of the second differential field effect transistor is configured to receive a second leg of the differential drive signal, and a drain of the second differential field effect transistor is coupled to the second drain of the second field effect transistor; and
a third field effect transistor comprising a third gate and a third drain, wherein the third gate of the third field effect transistor is coupled to sources of the first and second differential field effect transistors,
wherein the first multiplexer input node is coupled to the first drain of the first field effect transistor, and the second multiplexer input node is coupled to the second drain of the second field effect transistor,
wherein the selector node comprises a first differential selector node and a second differential selector node, the first differential selector node is coupled to the gate of the first differential field effect transistor, and the second differential selector node is coupled to the gate of the second differential field effect transistor, and
wherein the multiplexer output node is coupled to the third drain of the third field effect transistor.

4. The semiconductor analogue circuit of claim 3,
wherein the multiplier comprises a first differential bipolar transistor and a second differential bipolar transistor, wherein the first multiplier node comprises a first differential multiplier node and a second differential multiplier node, the first differential multiplier node is coupled to a base of the first differential bipolar transistor, and the second differential multiplier node is coupled to a base of the second differential bipolar transistor,
wherein the second multiplier node is coupled to emitters of the first and second differential bipolar transistors, and
wherein the multiplier output node comprises a first differential multiplier output node and a second differential multiplier output node, the first differential multiplier output node is coupled to a collector of the first differential bipolar transistor, and the second differential multiplier output node is coupled to a collector of the second differential bipolar transistor.

5. The semiconductor analogue circuit of claim 1,
wherein the drive signal comprises a differential drive signal;
wherein the multiplexer comprises:
a first field effect transistor comprising a first gate coupled to a first drain, wherein the first drain of the first field effect transistor is configured to receive the first weight signal;
a second field effect transistor comprising a second gate coupled to a second drain, wherein the second drain of the second field effect transistor is configured to receive the second weight signal;
a third field effect transistor comprising a third gate and a third drain, wherein the third gate of the third field effect transistor is coupled to the first gate and the first drain of the first field effect transistor;
a fourth field effect transistor comprising a fourth gate and a fourth drain, wherein the fourth gate of the fourth field effect transistor is coupled to the second gate and the second drain of the second field effect transistor;
a first differential bipolar transistor, wherein an emitter of the first differential bipolar transistor is coupled to the third drain of the third field effect transistor, and a base of the first differential bipolar transistor is configured to receive a first leg of the differential drive signal; and
a second differential bipolar transistor, wherein an emitter of the second differential bipolar transistor is coupled to the fourth drain of the fourth field effect transistor, and a base of the second differential bipolar transistor is configured to receive a second leg of the differential drive signal;
wherein the first multiplexer input node is coupled to the first drain of the first field effect transistor, and the second multiplexer input node is coupled to the second drain of the second field effect transistor,
wherein the selector node comprises a first differential selector node and a second differential selector node, the first differential selector node is coupled to the base of the first differential bipolar transistor, and the second differential selector node is coupled to the base of the second differential bipolar transistor, and
wherein the multiplexer output node is coupled to collectors of the first and second differential bipolar transistors.

6. The semiconductor analogue circuit of claim 5,
wherein the multiplier comprises a third differential bipolar transistor and a fourth differential bipolar transistor, wherein the first multiplier node comprises a first differential multiplier node and a second differential multiplier node, the first differential multiplier node is coupled to a base of the third differential bipolar transistor, and the second differential multiplier node is coupled to a base of the fourth differential bipolar transistor, wherein the second multiplier node is coupled to emitters of the third and fourth differential bipolar transistors, and wherein the multiplier output node comprises a first differential multiplier output node and a second differential multiplier output node, the first differential multiplier output node is coupled to a collector of the third differential bipolar transistor, and the second differential multiplier output node is coupled to a collector of the fourth differential bipolar transistor.

7. The semiconductor analogue circuit of claim 1,
wherein each of the other taps of the plurality of taps comprises a delay circuit,
wherein an input of the delay circuit is coupled to the drive output node, and
wherein an output of the delay circuit is coupled to the respective first multiplier node.

8. The semiconductor analogue circuit of claim 1, further comprising:
a second input circuit coupled between the input circuit and the selector nodes of the plurality of taps; and
a third input circuit coupled between the input circuit and the summer.

9. A circuit for pre-compensating a distortion being introduced by a directly modulated laser (DML) and for providing a pre-compensated drive signal to the DML to pre-compensate the distortion being introduced by the DML, the circuit comprising:
an input circuit;
a non-linear filter coupled to the input circuit; and
a summer coupled to the input circuit and the non-linear filter,
wherein the input circuit comprises a drive input node and a drive output node,
wherein the input circuit is configured to receive a drive input signal at the drive input node and configured to provide a drive signal at the drive output node,
wherein the non-linear filter comprises a plurality of taps arranged in parallel,
wherein each tap of the plurality of taps comprises a tap output node,
wherein each tap of the plurality of taps comprises a multiplexer and a multiplier,
wherein the multiplexer together with the multiplier are configured to generate a non-linear tap output signal at the tap output node,
wherein the multiplexer is coupled to the drive output node,
wherein the multiplexer comprises a first multiplexer input node, a second multiplexer input node, a selector node, and a multiplexer output node,
wherein the multiplexer is configured to receive a first weight signal at the first multiplexer input node, configured to receive a second weight signal at the second multiplexer input node, and configured to receive the drive signal at the selector node,
wherein the multiplexer is configured to select the first weight signal or the second weight signal based on the drive signal's instantaneous amplitude and configured to produce the selected one of the first weight signal or the second weight signal at the multiplexer output node, wherein:
the instantaneous amplitude of the drive signal itself is used during an operation of the multiplexer to select the first weight signal or the second weight signal for the multiplexer;
when the drive signal's instantaneous amplitude is a first level, the multiplexer is configured to select the first weight signal;
when the drive signal's instantaneous amplitude is a second level, the multiplexer is configured to select the second weight signal;
the first level is different from the second level; and
the first weight signal is different from the second weight signal, such that the non-linear tap output signal at the tap output node has a first characteristic for the first level instantaneous amplitude of the drive signal, which is different from a second characteristic for the second level instantaneous amplitude of the drive signal,
wherein the multiplier is coupled to the drive output node and the multiplexer output node,
wherein the multiplier comprises a first multiplier node coupled to the drive output node, a second multiplier node coupled to the multiplexer output node, and a multiplier output node,
wherein the multiplier is configured to receive a tap signal at the first multiplier node, configured to receive the selected one of the first weight signal or the second weight signal at the second multiplier node, configured to scale the tap signal based on the selected one of the first weight signal or the second weight signal, and configured to produce the scaled tap signal at the multiplier output node,
wherein the tap signal is scaled differently depending on the instantaneous amplitude of the drive signal,
wherein the non-linear tap output signal is the scaled tap signal,
wherein the tap output node is the multiplier output node,
wherein the tap signal for a first tap of the plurality of taps comprises the drive signal,
wherein each of the tap signals for other taps of the plurality of taps comprises a respective delayed version of the drive signal,
wherein the summer is coupled to the drive output node and the tap output nodes of the plurality of taps, and
wherein the summer is configured to sum the drive signal from the drive output node and the non-linear tap output signals from the tap output nodes of the plurality of taps, configured to produce the pre-compensated drive signal, and configured to drive the DML using the pre-compensated drive signal.

10. The circuit of claim 9, wherein:
the first weight signal comprises a first current signal;
the second weight signal comprises a second current signal different from the first current signal;
the drive signal comprises a differential drive signal;
the selector node comprises: a first differential selector node configured to receive a first leg of the differential drive signal; and a second differential selector node configured to receive a second leg of the differential drive signal;
the tap signal comprises a first differential tap signal and a second differential tap signal;
the first multiplier node comprises: a first differential multiplier node configured to receive the first differential tap signal; and a second differential multiplier node configured to receive the second differential tap signal; and the summer comprises a first differential summer node and a second differential summer node.

11. The circuit of claim 9,
wherein the drive signal comprises a differential drive signal;
wherein the multiplexer comprises:
 a first field effect transistor comprising a gate coupled to a drain, wherein the drain of the first field effect transistor is configured to receive the first weight signal;
 a second field effect transistor comprising a gate coupled to a drain, wherein the drain of the second field effect transistor is configured to receive the second weight signal;
 a pair of differential field effect transistors comprising a first differential field effect transistor and a second differential field effect transistor, wherein
  a gate of the first differential field effect transistor is configured to receive a first leg of the differential drive signal, and a drain of the first differential field effect transistor is coupled to the drain of the first field effect transistor; and
  a gate of the second differential field effect transistor is configured to receive a second leg of the differential drive signal, and a drain of the second differential field effect transistor is coupled to the drain of the second field effect transistor; and
 a third field effect transistor comprising a gate and a drain, wherein the gate of the third field effect transistor is coupled to sources of the first and second differential field effect transistors,
wherein the first multiplexer input node is coupled to the drain of the first field effect transistor, and the second multiplexer input node is coupled to the drain of the second field effect transistor,
wherein the selector node comprises a first differential selector node and a second differential selector node, the first differential selector node is coupled to the gate of the first differential field effect transistor, and the second differential selector node is coupled to the gate of the second differential field effect transistor, and
wherein the multiplexer output node is coupled to the drain of the third field effect transistor.

12. The circuit of claim 11,
wherein the multiplier comprises a first differential bipolar transistor and a second differential bipolar transistor,
wherein the first multiplier node comprises a first differential multiplier node and a second differential multiplier node, the first differential multiplier node is coupled to a base of the first differential bipolar transistor, and the second differential multiplier node is coupled to a base of the second differential bipolar transistor,
wherein the second multiplier node is coupled to emitters of the first and second differential bipolar transistors, and
wherein the multiplier output node comprises a first differential multiplier output node and a second differential multiplier output node, the first differential multiplier output node is coupled to a collector of the first differential bipolar transistor, and the second differential multiplier output node is coupled to a collector of the second differential bipolar transistor.

13. The circuit of claim 9,
wherein the drive signal comprises a differential drive signal;
wherein the multiplexer comprises:
 a first field effect transistor comprising a gate coupled to a drain, wherein the drain of the first field effect transistor is configured to receive the first weight signal;
 a second field effect transistor comprising a gate coupled to a drain, wherein the drain of the second field effect transistor is configured to receive the second weight signal;
 a third field effect transistor comprising a gate and a drain, wherein the gate of the third field effect transistor is coupled to the gate and the drain of the first field effect transistor;
 a fourth field effect transistor comprising a gate and a drain, wherein the gate of the fourth field effect transistor is coupled to the gate and the drain of the second field effect transistor;
 a first differential bipolar transistor, wherein an emitter of the first differential bipolar transistor is coupled to the drain of the third field effect transistor, and a base of the first differential bipolar transistor is configured to receive a first leg of the differential drive signal; and
 a second differential bipolar transistor, wherein an emitter of the second differential bipolar transistor is coupled to the drain of the fourth field effect transistor, and a base of the second differential bipolar transistor is configured to receive a second leg of the differential drive signal;
wherein the first multiplexer input node is coupled to the drain of the first field effect transistor, and the second multiplexer input node is coupled to the drain of the second field effect transistor,
wherein the selector node comprises a first differential selector node and a second differential selector node, the first differential selector node is coupled to the base of the first differential bipolar transistor, and the second differential selector node is coupled to the base of the second differential bipolar transistor, and
wherein the multiplexer output node is coupled to collectors of the first and second differential bipolar transistors.

14. The circuit of claim 13,
wherein the multiplier comprises a third differential bipolar transistor and a fourth differential bipolar transistor,
wherein the first multiplier node comprises a first differential multiplier node and a second differential multiplier node, the first differential multiplier node is coupled to a base of the third differential bipolar transistor, and the second differential multiplier node is coupled to a base of the fourth differential bipolar transistor,
wherein the second multiplier node is coupled to emitters of the third and fourth differential bipolar transistors, and
wherein the multiplier output node comprises a first differential multiplier output node and a second differential multiplier output node, the first differential multiplier output node is coupled to a collector of the third differential bipolar transistor, and the second differential multiplier output node is coupled to a collector of the fourth differential bipolar transistor.

15. The circuit of claim 9,
wherein each of the other taps of the plurality of taps comprises a delay circuit,
wherein an input of the delay circuit is coupled to the drive output node, and
wherein an output of the delay circuit is coupled to the respective first multiplier node.

16. The circuit of claim 9, further comprising:
a second input circuit coupled between the input circuit and the selector nodes of the plurality of taps; and
a third input circuit coupled between the input circuit and the summer.

* * * * *